United States Patent
Kim et al.

(10) Patent No.: US 6,404,011 B2
(45) Date of Patent: Jun. 11, 2002

(54) SEMICONDUCTOR POWER INTEGRATED CIRCUIT

(75) Inventors: Jong-Dae Kim; Sang-Gi Kim; Jin-Gun Koo; Dae-Yong Kim, all of Taejon (KR)

(73) Assignee: Electronics and Telecommunications Research Institute (KR)

(*) Notice: Subject to any disclaimer, the term of this patent is extended or adjusted under 35 U.S.C. 154(b) by 0 days.

(21) Appl. No.: 09/865,004

(22) Filed: May 23, 2001

Related U.S. Application Data (63) Continuation of application No. 09/428,403, filed on Oct. 28, 1999, now Pat. No. 6,284,605.

(30) Foreign Application Priority Data

Oct. 28, 1998 (KR) .............................................. 98-45269

(51) Int. Cl.$^7$ .............................................. H01L 29/76
(52) U.S. Cl. ........................ 257/341; 257/510; 257/500
(58) Field of Search ................................ 257/341–342, 257/335, 339, 487–494, 500–510

(56) References Cited

U.S. PATENT DOCUMENTS

| | | | |
|---|---|---|---|
| 5,168,331 A | * 12/1992 | Yilmaz ........................ 257/331 |
| 5,283,201 A | 2/1994 | Tsang |
| 5,567,634 A | 10/1996 | Hebert et al. |
| 5,618,751 A | 4/1997 | Golden et al. |
| 5,648,281 A | * 7/1997 | Williams et al. |
| 6,239,463 B1 | * 5/2001 | Williams et al. ............. 257/328 |

FOREIGN PATENT DOCUMENTS

JP  63-131542  6/1988

OTHER PUBLICATIONS

Boron Out Diffusion From Is Substrates in Various Ambients by K. Suzuki pp. 1095–1097, 1978.
Tapered Windows in Phosphorous–Doped SiO2 by Ion Implantation by J. North pp. 809–812, 1996.

* cited by examiner

Primary Examiner—Jey Tsai
(74) Attorney, Agent, or Firm—Blakely Sokoloff Taylor & Zafman (57) ABSTRACT

A method for fabricating a semiconductor power integrated circuit includes the steps of forming a semiconductor structure having at least one active region, wherein an active region includes a well region for forming a source and a drift region for forming a drain region, forming a trench for isolation of the active regions, wherein the trench has a predetermined depth from a surface of the semiconductor structure, forming a first TEOS-oxide layer inside the trench and above the semiconductor structure, wherein the first TEOS-oxide layer has a predetermined thickness from the surface of the semiconductor device, forming a second TEOS-oxide layer on the first TEOS-oxide layer, wherein a thickness of the second TEOS-oxide layer is smaller than that of the first TEOS-oxide layer, and performing a selective etching to the first and second TEOS-oxide layers, to thereby simultaneously form a field oxide layer pattern, a diode insulating layer pattern and a gate oxide layer pattern, to thereby reduce processing steps and obtain a low on-resistance.

6 Claims, 9 Drawing Sheets

SEMICONDUCTOR POWER INTEGRATED CIRCUIT

This is a divisional application of Ser. No. 09/428,403 filed Oct. 28, 1999, now U.S. Pat. No. 6,284,605.

FIELD OF THE INVENTION

The present invention relates to a semiconductor power integrated circuit; and, more particularly, to a semiconductor power integrated circuit and a method for fabricating the same having a trench isolation, in which a field oxide layer, a gate oxide layer and a diode insulating layer are simultaneously formed together with a trench filling, thereby reducing processing steps and obtaining a low on-resistance.

DESCRIPTION OF THE PRIOR ART

Semiconductor power integrated circuits (ICs) for use in a high voltage of 100V to 500V have been used as driver ICs in such as step motors, FED (field emission display) and PDP (plasma display panel). In fabricating the semiconductor power IC having a high breakdown voltage of 30V to 100V, an isolation technology is very important since it directly relates to a packing density and a leakage current.

Figure 1:
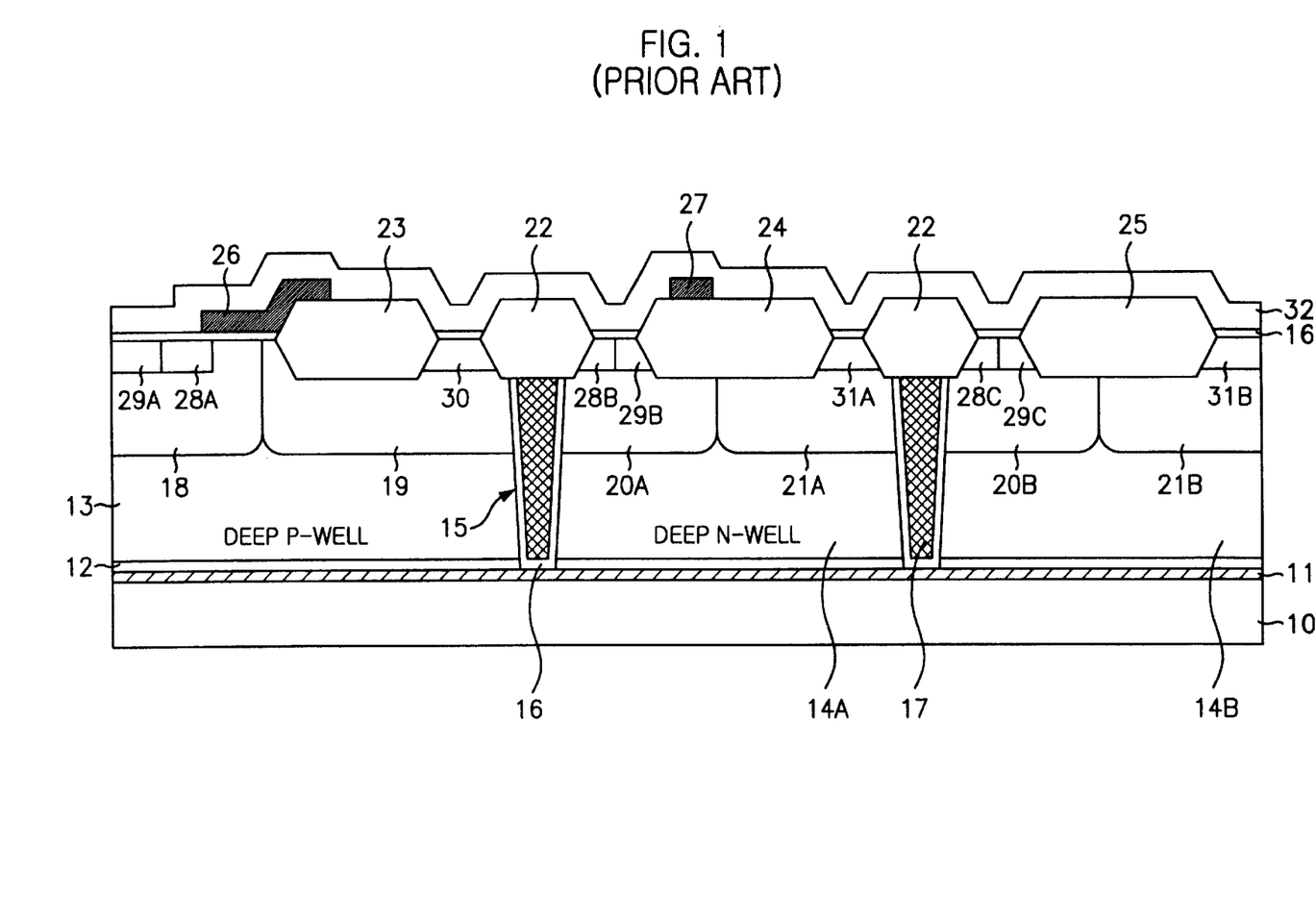
FIG. 1 is a cross-sectional diagram illustrating a semiconductor power IC in accordance with the prior art.

Referring to FIG. 1, a conventional trench filling technology used for isolation in the semiconductor power device will be described below.

A buried oxide layer 11 and a P-epi (epitaxial) layer 12 are sequentially formed on an N-type silicon substrate 10. A deep P-well region 13 and deep N-well regions 14A and 14B are formed on the P-epi layer 12. Then, an ion implantation is performed to form a P-well region 18, an N-drift region 19, N-well regions 20A and 20B and P-drift regions 21A and 21B. Thereafter, the deep P-well region 13 and the deep N-well regions 14A and 14B are selectively etched to form a trench 15 to thereby expose the buried oxide layer 11.

A TEOS (tetra-ethyl-ortho-silicate)-oxide layer 16 is formed on a whole surface of the semiconductor structure after forming the trench 15 and the polysilicon layer 17 is then formed on the TEOS-oxide layer 16 to thereby fill the trench 15. Then, an etch back or a chemical mechanical polishing (CMP) is performed to planarize a surface of an entire structure after filling the trench 15. Thereafter, a local oxidation of silicon (LOCOS) process is performed at a temperature of about 1000° C. for a long time to form a field oxide layer 23, a trench isolation layer 22, a gate oxide layer 24 and a diode insulating layer 25.

Gate electrodes 26 and 27 are formed on the field oxide layer 23 and the gate oxide layer 24. A n$^+$ source regions 28A to 28C, p$^+$ source regions 29A to 29C, n$^+$ drain region 30, and p$^+$ drain regions 31A and 31B are formed on the P-well region 18, the N-drift region 19, the N-well regions 20A and 20B and the P-drift regions 21A and 21B by an ion implantation of impurities.

In semiconductor power IC fabricated by the above-mentioned method, a breakdown voltage and an on-resistance are controlled by the deep N-well regions 14A and 14B and the P-drift regions 21A and 21B, wherein the deep N-well regions 14A and 14B are formed on the P-epi layer 12 having a high resistivity. That is, a breakdown voltage of a vertical direction is determined by a thickness and impurity concentration of the P-epi layer 12 and a depth and impurity concentration of the P-drift regions 21A and 21B. A breakdown voltage of a horizontal direction is determined by a distance between the p$^+$ drain regions 31A and 31B and the p$^+$ source regions 29B and 29C.

Additionally, in case where the impurity concentration of the P-drift regions 21A and 21B are low, the voltage breakdown occurs at a drain edge, and in case where the impurity concentration of the P-drift regions 21A and 21B is high, the voltage breakdown occurs at a gate edge.

However, it is difficult to prevent the deep N-well regions 14A and 14B and the N-well regions 20A and 20B from the impurity redistribution since a thermal treatment process is performed at a high temperature for a long time to form the field oxide layer 23, the trench isolation layer 22, the gate oxide layer 24 and the diode insulating layer 25. Therefore, there may occur a problem that the device characteristic is greatly degraded.

SUMMARY OF THE INVENTION

It is, therefore, an object of the present invention to provide a semiconductor power integrated circuit and a method for fabricating the same, in which processing steps are reduced and a low on-resistance can be obtained.

In accordance with an embodiment of the present invention, there is provided a method for fabricating a semiconductor power integrated circuit, comprising the steps of: a) forming a semiconductor structure having at least one active region, wherein an active region includes a well region for forming a channel and a source, and a drift region for forming a drain region; b) forming a trench for isolation of the active regions, wherein the trench has a predetermined depth from a surface of the semiconductor structure; c) forming a first TEOS-oxide layer inside the trench and above the semiconductor structure, wherein the first TEOS-oxide layer has a predetermined thickness from the surface of the semiconductor device; d) forming a second TEOS-oxide layer on the first TEOS-oxide layer, wherein a thickness of the second TEOS-oxide layer is smaller than that of the first TEOS-oxide layer; and e) performing a selective etching to the first and second TEOS-oxide layers, to thereby simultaneously form a field oxide layer pattern and a gate oxide layer pattern.

In accordance with another embodiment of the present invention, there is provided a semiconductor power integrated circuit, comprising; a) a semiconductor structure having a trench with a predetermined depth from a surface of the semiconductor structure, wherein the semiconductor structure includes an active region having a well region for forming a channel and a source, and a drift region for forming a drain region; b) a trench isolation layer pattern including a first oxide layer and a second oxide layer, wherein the first oxide layer fills inside the trench and has a predetermined thickness from the surface of the semiconductor structure, and wherein the second oxide layer is formed on the first oxide layer and has a predetermined thickness smaller than the second oxide layer; c) a field oxide layer pattern including a third oxide layer and a fourth oxide layer, wherein the third oxide layer is simultaneously formed with the same layer as the first oxide layer of the field oxide layer pattern and has a predetermined thickness from a surface of the semiconductor structure, and wherein the fourth oxide layer is simultaneously formed with the same layer as the second oxide layer of the field oxide layer of the field oxide layer pattern and has a thickness smaller than the third oxide layer; and d) a gate oxide layer pattern including a fifth oxide layer and a sixth oxide layer, wherein the fifth oxide layer is simultaneously formed with the same layer as the first oxide layer of the field oxide layer pattern and has a predetermined thickness from a surface of the semiconductor structure, and wherein the sixth oxide layer is simultaneously formed with the same layer as the second oxide layer of the field oxide layer of the field oxide layer pattern and has a thickness smaller than the third oxide layer.

BRIEF DESCRIPTION OF THE DRAWINGS

Other objects and aspects of the invention will become apparent from the following description of the embodiments with reference to the accompanying drawings, in which.

DETAILED DESCRIPTION OF THE PREFERRED EMBODIMENTS

Referring to FIGS. 2A to 2G, a semiconductor power integrated circuit in accordance with the present invention will be described in detail.

Figure 2A:
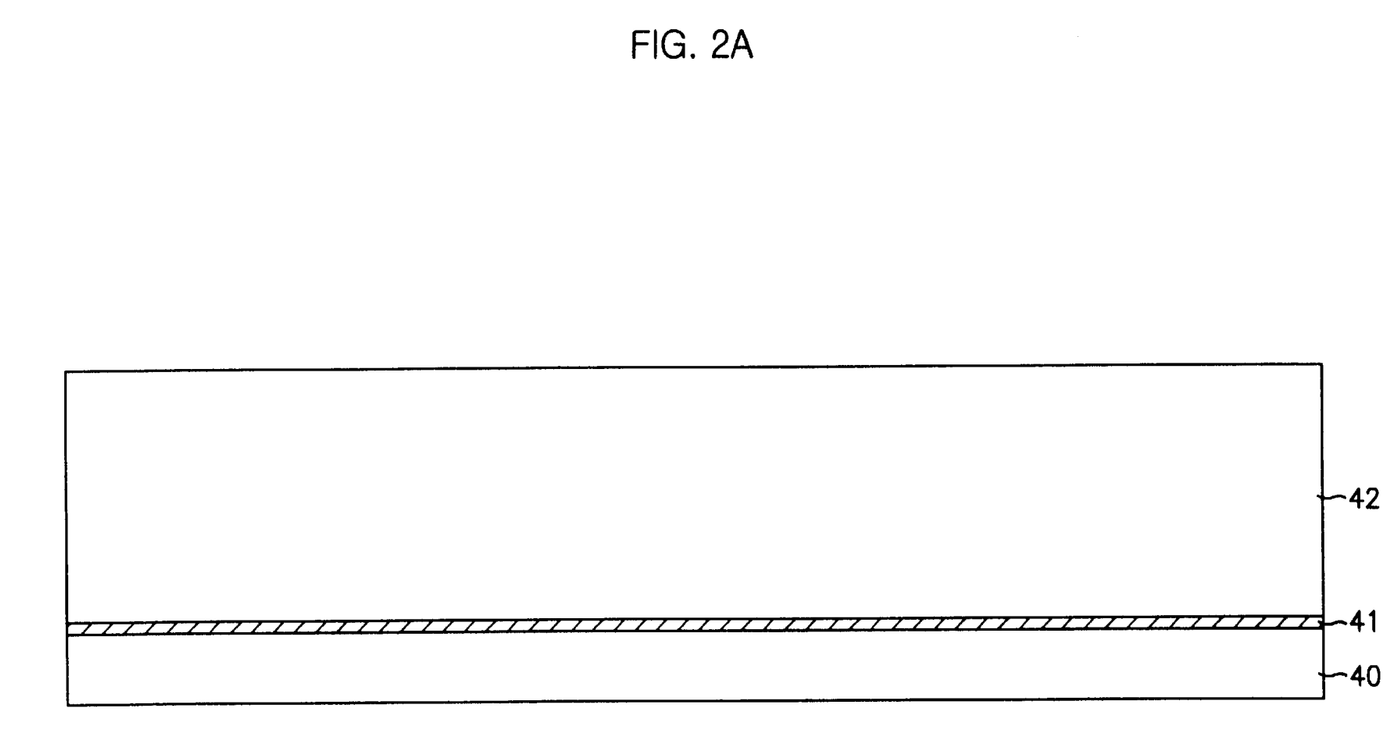
FIGS. 2A–2G are cross-sectional diagrams illustrating a semiconductor power IC in accordance with the present invention.

Referring to FIG. 2A, a buried oxide layer 41 and a P-epi layer 42 are sequentially formed on an N-type silicon substrate 40.

Figure 2B:
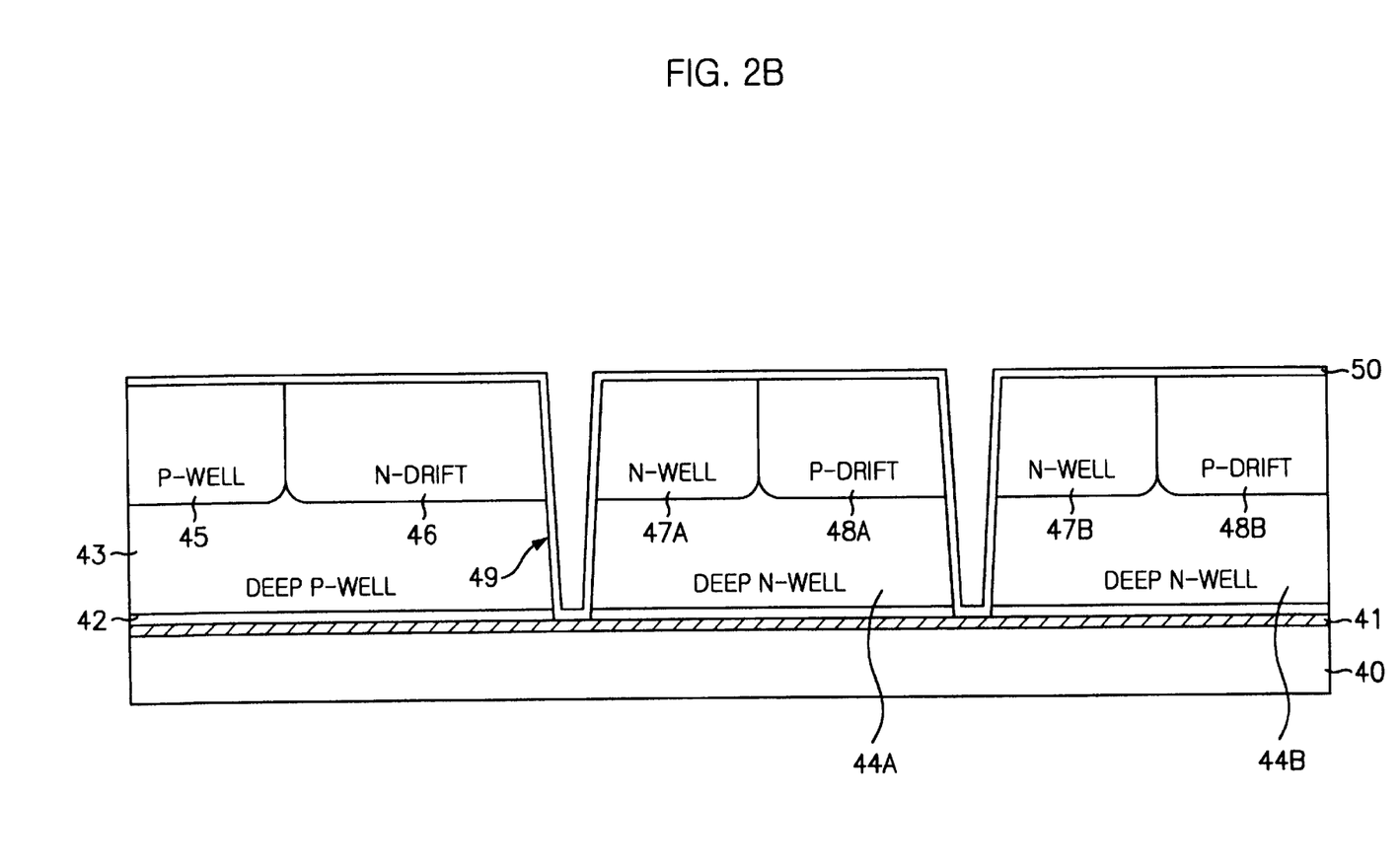

Referring to FIG. 2B, a deep P-well region 43 and deep N-well regions 44A and 44B are formed on the P-epi layer 42. Thereafter, a drive-in of the deep P-well region 43 and the deep N-well regions 44A and 44B is conducted at a high temperature to form a P-well region 45 with a predetermined depth from a surface of the deep P-well region 43, and N-well regions 47A and 47B with a predetermined depth from a surface of the deep N-well regions 44A and 44B. Sequentially, selectively performing an ion implantation, an N-drift region 46 and P-drift regions 48A and 48B are formed at regions neighboring to the P-well region 45 and the N-well regions 47A and 47B. Here, a region including the P-well region 45 and the N-drift region 46, and a region including the N-well regions 47A and 47B and the P-drift regions 48A and 48B, respectively, are called an active region. Here, channels and source regions are formed in the P-well region and the N-well region 47A and 47B , and drain regions are formed in the N-drift region 46 and the P-drift regions 48A and 48B. Thereafter, a trench 49 for isolation of the active regions is formed by selectively etching the active regions and the deep N-well and deep P-well regions, wherein the trench 49 has a predetermined depth from a surface of a entire structure. At this time, the etching process is performed using a mixed gas of HBr and $SiF_4$, wherein the mixed gas contains 45 percent He and $O_2$. Then, a thermal oxide layer 50 is formed on an entire structure after forming the trench 49 to a thickness of approximately 500 Å.

Figure 2C:
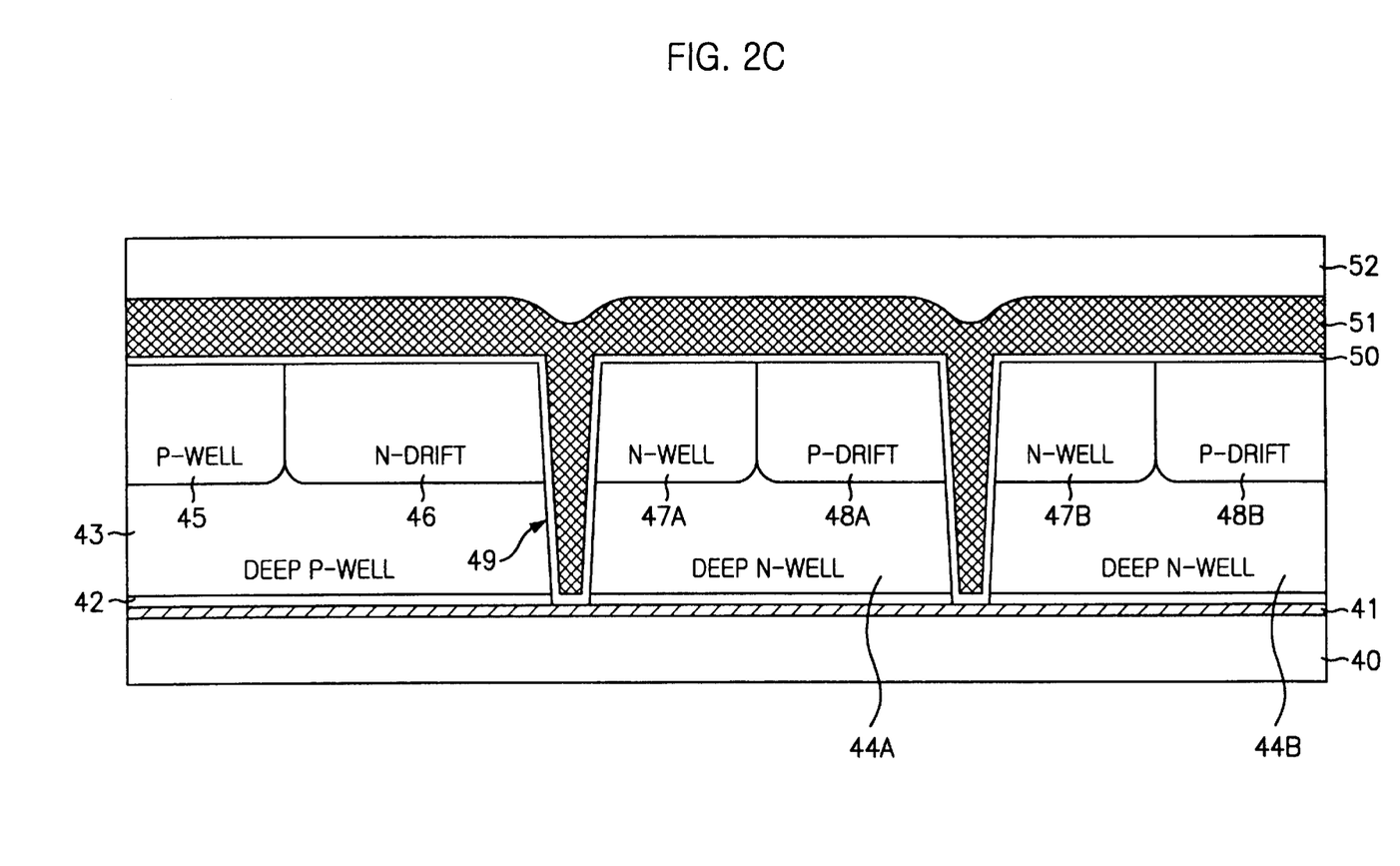

Referring to FIG. 2C, a first TEOS-oxide layer 51 is formed on the thermal oxide layer 50 and above the entire structure. The first TEOS-oxide layer 51 fills the trench 49 and has a thickness of 8000 Å to 15000 Å from a surface of the entire structure. Then, a thermal treatment process is performed to the first TEOS-oxide layer 51 at a temperature of approximately 850° C. for 30 minutes. Sequentially, an SOG (Spin On Glass) layer 52 is formed on the first TEOS-oxide layer 51, wherein an etching selectivity of the SOG layer 52 is similar to that of the first TEOS-oxide layer 51. Thereafter, the first TEOS-oxide layer 51 is planarized performing an etch back to the SOG layer 52 and a part of the first TEOS-oxide layer 51.

Figure 2D:
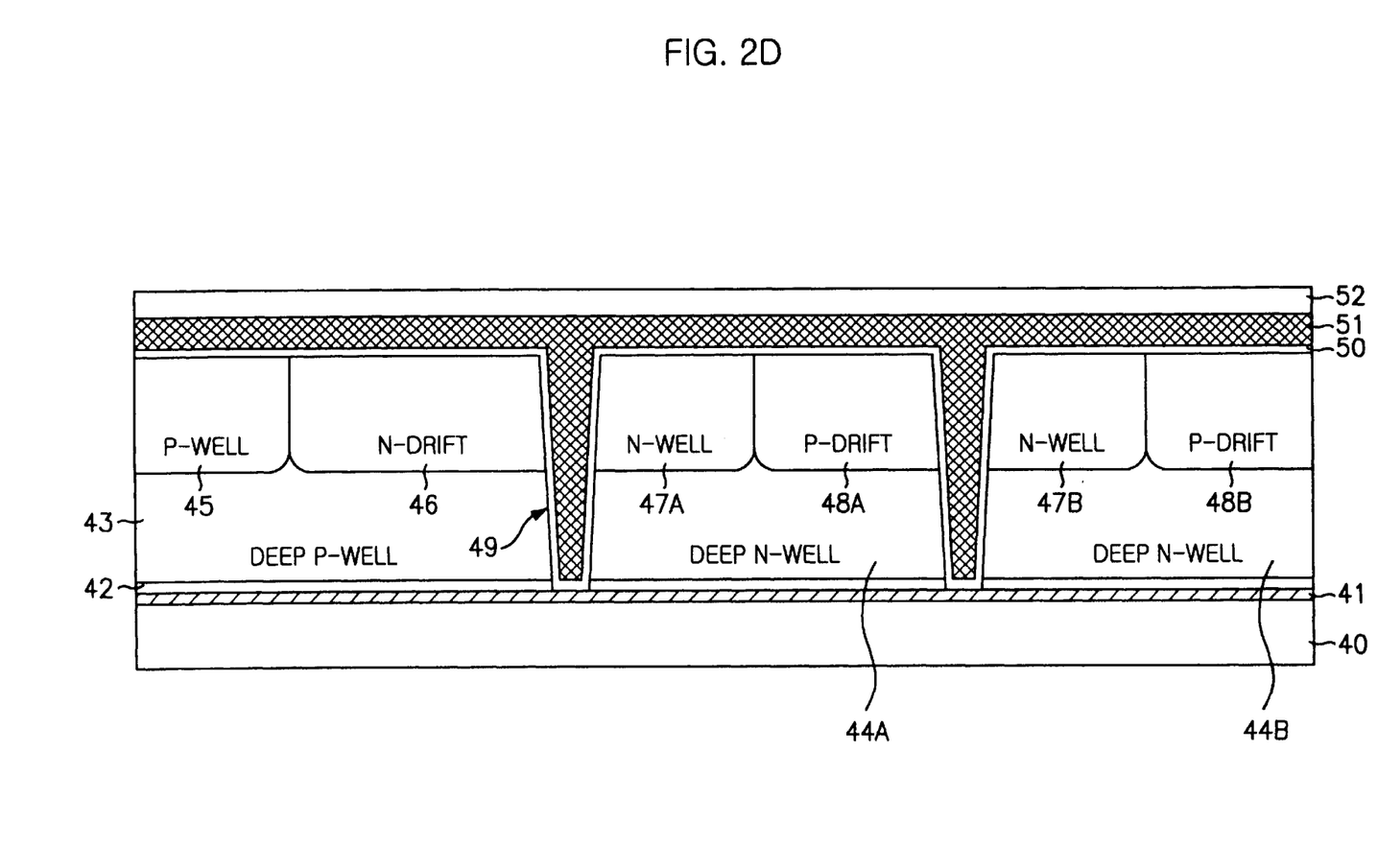

Referring to FIG. 2D, a second TEOS-oxide layer 52 is formed on the first TEOS-oxide layer 51 to a thickness of 2000 Å to 5000 Å.

Figure 2E:
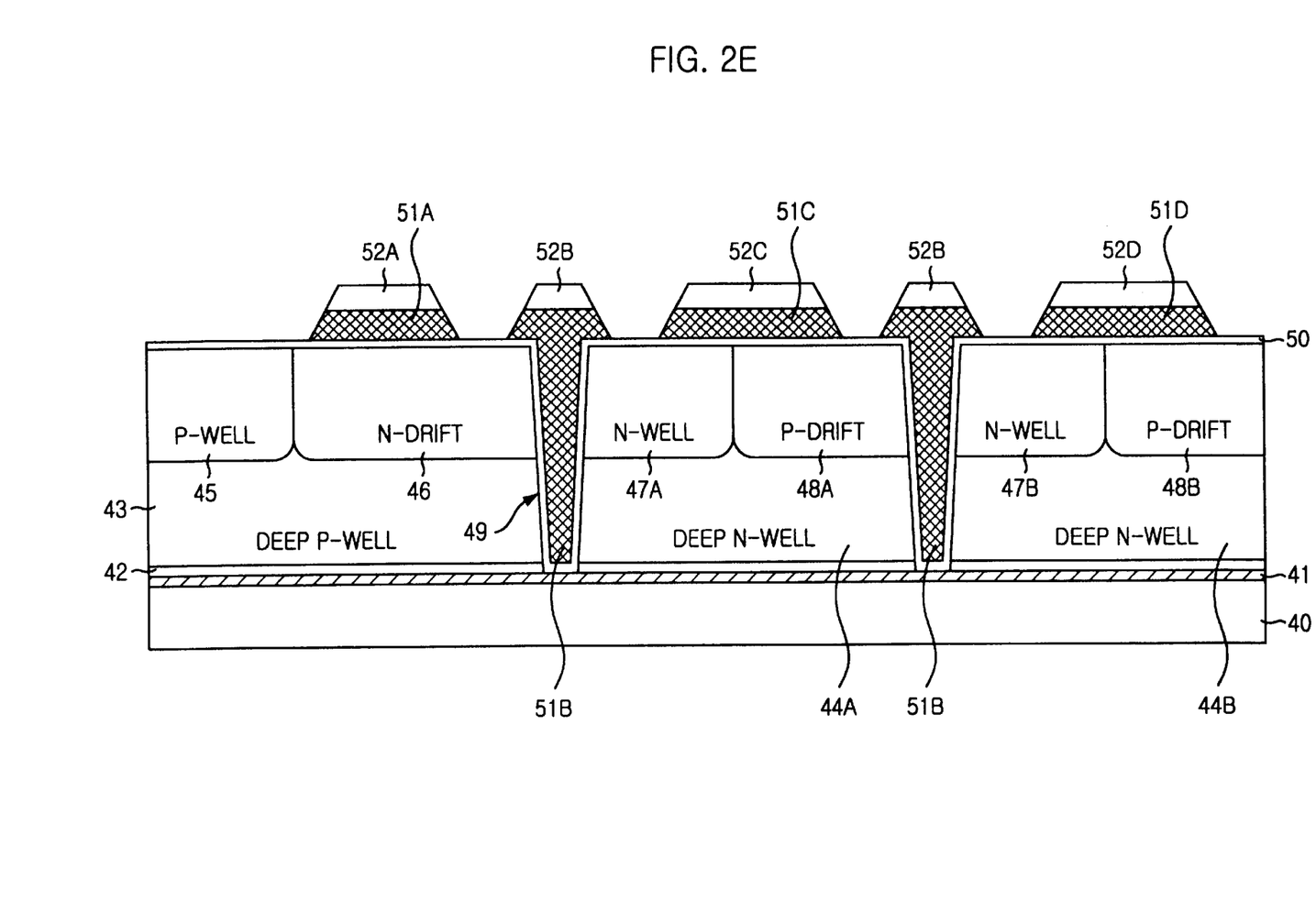

Referring to FIG. 2E, a photoresist (not shown in FIG. 2E) is formed on the second TEOS-oxide layer (52, in FIG. 2D). Then, a taper etching process is performed to the first TEOS-oxide layer (52, FIG. 2D) and the second TEOS-oxide layer (51, FIG. 2D) through a BOE (buffered oxide etchant) to thereby simultaneously form a field oxide layer pattern 51A and 52A, a trench isolation layer pattern 51B and 52B, a gate oxide layer pattern 51C and 52C and a diode insulating layer 51D and 52D. At this time, an etching rate of the first TEOS-oxide layer (51, FIG. 2D) is different from that of the second TEOS-oxide layer (52, FIG. 2D) because the thermal treatment process is performed only to the first TEOS-oxide layer and not to the second TEOS-oxide layer. Due to the different etching rate between the first TEOS-oxide layer and the second TEOS-oxide layer, the field oxide layer pattern 51A and 52A, the trench isolation layer pattern 51B and 52B, the gate oxide layer pattern 51C and 52C and the diode insulating layer pattern 51D and 52D have tapered side-walls.

Figure 2F:
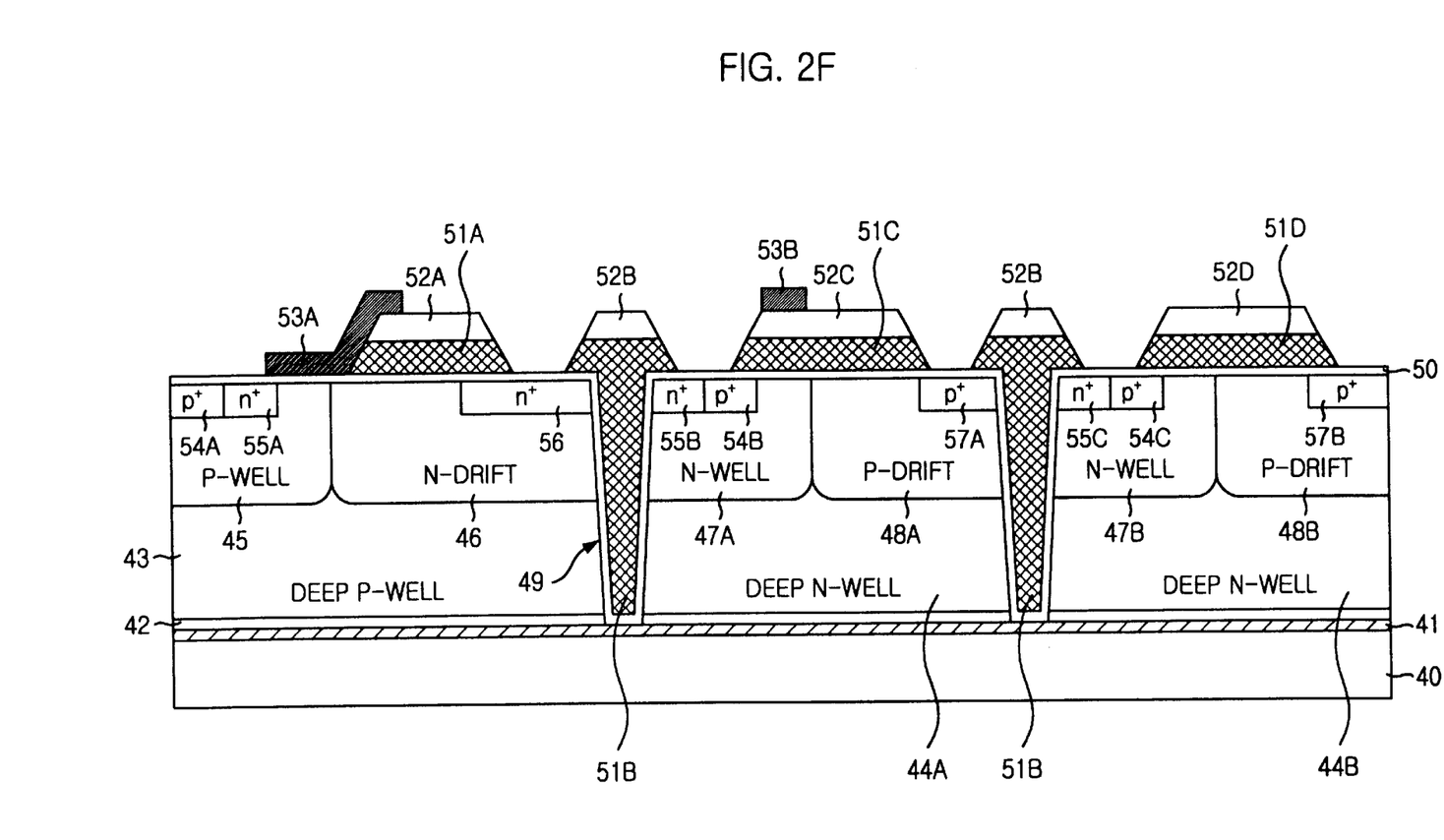

Referring to FIG. 2F, gate electrodes 53A and 53B are formed on the field oxide layer pattern 52A and the gate oxide layer pattern 52C. Then, $p^+$ source regions 54A and $n^+$ source region 55A, and $n^+$ drain region 56 are formed on the P-well region 45 and the N-drift region 46, respectively. Further, $n^+$ source regions 55B and 55C and $p^+$ source regions 54B and 54C, $p^+$ drain regions 57A and 57B are formed on the P-well regions 47A and 47B and the P-drift regions 48A and 48B, respectively.

Figure 2G:
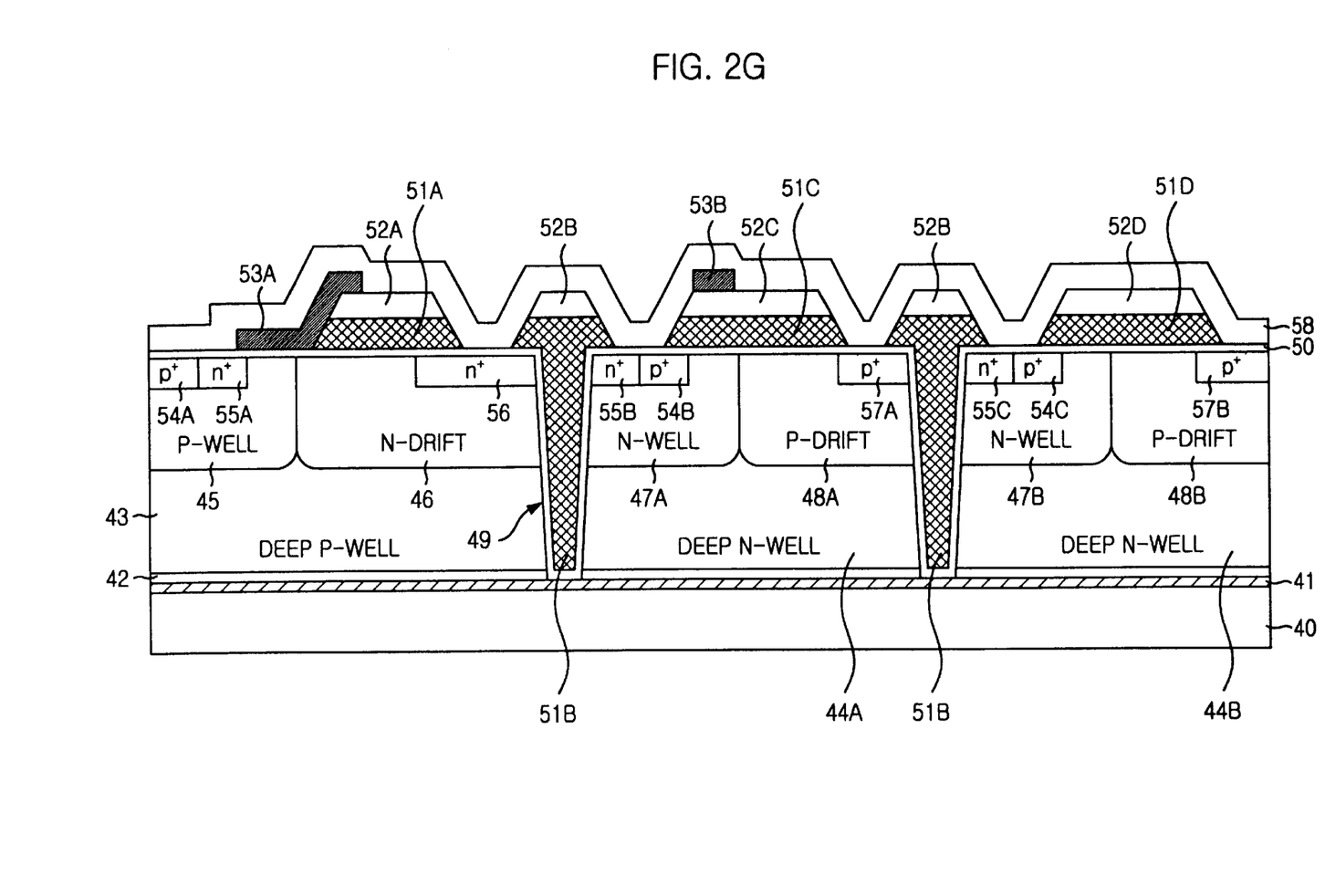

Referring to FIG. 2G, an insulating layer 63 is formed.

Referring again to FIG. 2G, a structure of the semiconductor power IC will be described below.

The semiconductor power IC in accordance with the present invention includes a semiconductor structure having a trench 49 with a predetermined depth from a surface of the semiconductor structure, a field oxide layer pattern 51A and 52A, a trench isolation layer pattern 51B and 52B, a gate oxide layer pattern 51C and 52C and an gate insulating layer pattern 51D and 52D.

The semiconductor structure includes a N-type semiconductor substrate 40, a buried oxide layer 41 formed on the N-type semiconductor substrate 40, an P-epi layer 42 formed on the buried oxide layer 41, a deep P-well region 43 and deep N-well regions 44A and 44B formed on the P-epi layer 42. Further, the semiconductor structure includes active regions, which include a P-well region 45 and a N-drift region 46, N-well regions 47A and 47B and P-drift regions 48A and 48B formed on the deep P-well regions 43 and the deep N-well regions 44A and 44B, and a thermal oxide layer 50 formed on the semiconductor structure having the trench 49. $p^+$ source regions 54A to 54C and $n^+$ source regions 55A to 55C is formed on the P-well region 45 and the N-well regions 47A and 47B. $n^+$ drain region 56 and $p^+$ drain regions 57A and 57B are formed on the N-drift region 46 and the P-drift regions 48A and 48B.

The field oxide layer pattern includes a first TEOS-oxide layer 51A and a second TEOS-oxide layer 52A, the trench isolation layer pattern includes a first TEOS-oxide layer 51B and 52B, wherein the first TEOS-oxide layer 51B fills the trench 49, the gate oxide layer includes a first TEOS-oxide layer 51C and 52C, and the diode insulating layer includes a first TEOS-oxide layer 51D and 52D. At this time, the first TEOS-oxide layer 51A to 51D is formed to a thickness of 8000 Å to 15000 Å from a surface of the semiconductor structure, and the second TEOS-oxide layers 52A to 52D are formed on the first TEOS-oxide layer 51A to 51D to a thickness of 2000 Å to 5000 Å. Further, the field oxide layer pattern, the trench isolation layer pattern, a gate oxide layer pattern and a diode insulating layer pattern are simultaneously formed.

Figure 3:
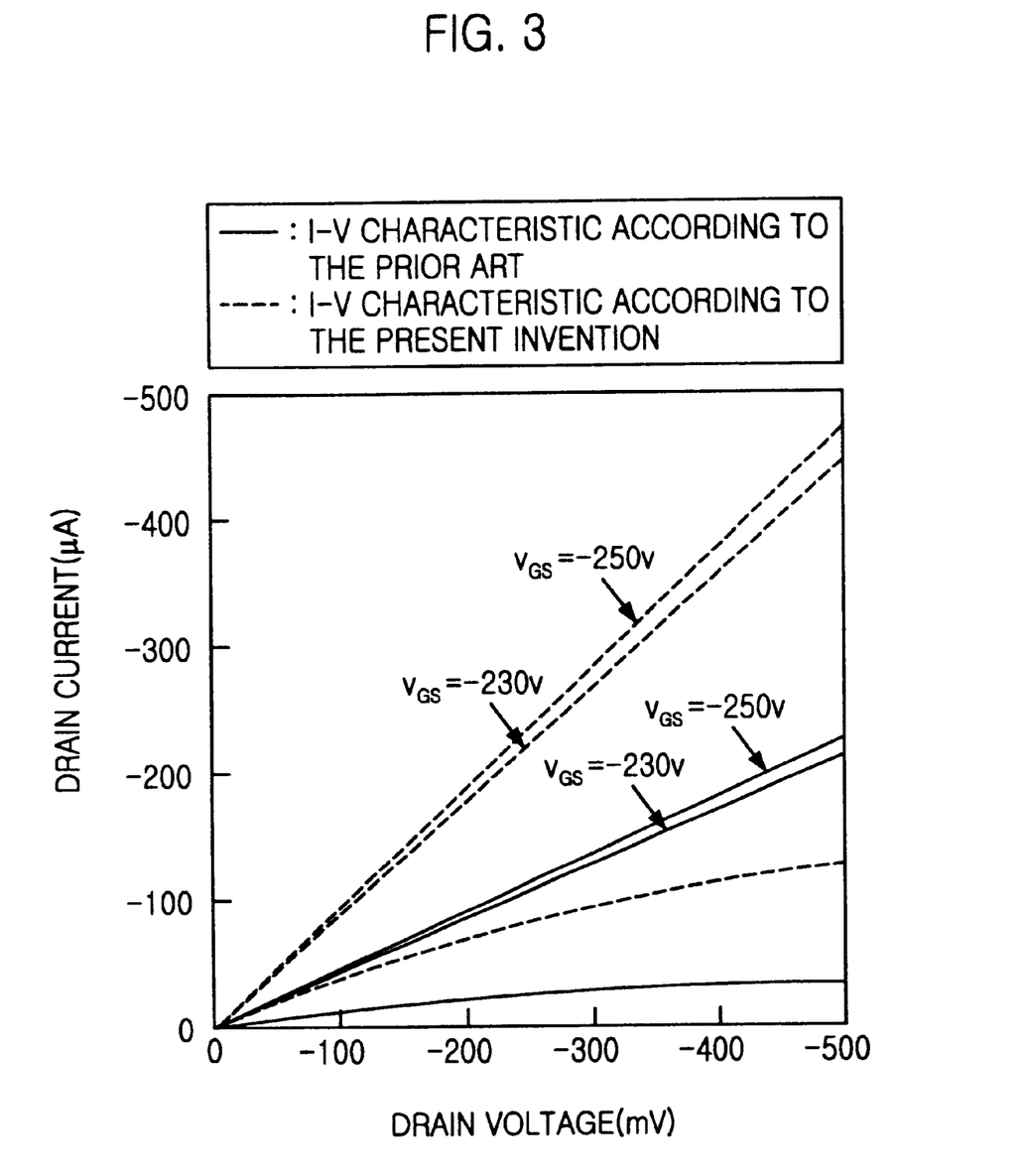
FIG. 3 is a graph illustrating a current/voltage characteristic of a semiconductor power IC.

FIG. 3 is a graph of a drain current ($I_D$) versus a drain voltage ($V_D$) for various values of gate-source voltage ($V_{GS}$). Here, a solid line and a dotted line represent a current/drain characteristic according to the prior art and the present invention, respectively. Compared with the prior art, an on-resistance of the semiconductor power device according to the present invention is relatively reduced, wherein the on-resistance is a value produced by dividing the drain voltage by the drain current.

Consequently, by forming the field oxide layer, the diode insulating layer, and the gate oxide layer together with the trench filling using the TEOS-oxide layer that is etched taperly, the fabricating steps can be reduced and simplified. Additionally, compared with the LOCOS method, the field oxide layer is formed with the TEOS-oxide layer at a relatively lower temperature, to thereby prevent an out-diffusion of impurities at the P-drift region and the P-epi layer. Accordingly, the impurity concentration and the junction depth can be easily controlled and the on-resistance of the semiconductor power IC can be effectively reduced. In addition, the effective drift length of the semiconductor power IC according to the present invention is shorter than that of the semiconductor power IC according to the prior art because the bird's beak is not generated during the formation of the TEOS tapered field oxide, while the bird's beak is essentially formed during the formation of the field oxide using the conventional LOCOS oxidation technique. Therefore, the on-resistance of the invented power devices is also decreased.

While the present invention has been described with respect to certain preferred embodiments only, other modifications and variation may be made without departing from the spirit and scope of the present invention as set forth in the following claims.

What is claimed is:

1. A semiconductor power integrated circuit, comprising;
   a) a semiconductor structure having a trench with a predetermined depth from a surface of the semiconductor structure, wherein the semiconductor structure includes an active region having a well region for forming a channel and a source, and a drift region for forming a drain region;
   b) a trench isolation layer pattern including a first oxide layer and a second oxide layer, wherein the first oxide layer fills inside the trench and has a predetermined thickness from the surface of the semiconductor structure, and wherein the second oxide layer is formed on the first oxide layer and has a predetermined thickness smaller than the second oxide layer;
   c) a field oxide layer pattern including a third oxide layer and a fourth oxide layer, wherein the third oxide layer is simultaneously formed with the same layer as the first oxide layer of the field oxide layer pattern and has a predetermined thickness from a surface of the semiconductor structure, and wherein the fourth oxide layer is simultaneously formed with the same layer as the second oxide layer of the field oxide layer of the field oxide layer pattern and has a thickness smaller than the third oxide layer; and
   d) a gate oxide layer pattern including a fifth oxide layer and a sixth oxide layer, wherein the fifth oxide layer is simultaneously formed with the same layer as the first oxide layer of the field oxide layer pattern and has a predetermined thickness from a surface of the semiconductor structure, and wherein the sixth oxide layer is simultaneously formed with the same layer as the second oxide layer of the field oxide layer of the field oxide layer pattern and has a thickness smaller than the third oxide layer.

2. The semiconductor power integrated circuit as recited in claim 1, wherein the first and second layers are TEOS-oxide layers.

3. The semiconductor power integrated circuit as recited in claim 2, wherein the predetermined thickness of the first oxide layer is of 8000 Å to 15000 Å and the predetermined thickness of the second oxide layer is of 2000 Å to 5000 Å.

4. The semiconductor power integrated circuit as recited in claim 3, wherein the semiconductor power device further comprises:
   a semiconductor substrate of a first conductivity type;
   a buried insulating layer formed on the semiconductor substrate of the first conductivity type; and
   an epitaxial layer of a second conductivity type formed on the buried insulating layer.

5. The semiconductor power integrated circuit as recited in claim 4, wherein the predetermined depth of the trench reaches to the epitaxial layer.

6. The semiconductor power integrated circuit as recited in claim 5, wherein the semiconductor power integrated circuit further comprises:
   a thermal oxide layer entirely formed on the semiconductor structure of the first conductivity type;
   a source region of the second conductivity type formed on the first region of the first conductivity type;
   a drain region of the second conductivity type formed on the second region of the second conductivity type; and
   a source region of the first conductivity type on the first well region of the first conductivity type.

* * * * *